(12) United States Patent
Kobayashi et al.

(10) Patent No.: US 12,131,889 B2
(45) Date of Patent: Oct. 29, 2024

(54) PLASMA GENERATING APPARATUS, PLASMA PROCESSING APPARATUS, AND PLASMA PROCESSING METHOD

(71) Applicant: Tokyo Electron Limited, Tokyo (JP)

(72) Inventors: Takeshi Kobayashi, Iwate (JP); Takeshi Ando, Yamanashi (JP); Kiwamu Ito, Yamanashi (JP); Yuki Tanaka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 259 days.

(21) Appl. No.: 17/502,540

(22) Filed: Oct. 15, 2021

(65) Prior Publication Data
US 2022/0122812 A1    Apr. 21, 2022

(30) Foreign Application Priority Data

Oct. 20, 2020  (JP) ................................. 2020-175968

(51) Int. Cl.
*H01J 37/32*  (2006.01)
(52) U.S. Cl.
CPC .. *H01J 37/32532* (2013.01); *H01J 37/32091* (2013.01); *H01J 37/32183* (2013.01); *H01J 37/32458* (2013.01)
(58) Field of Classification Search
None
See application file for complete search history.

(56) References Cited

U.S. PATENT DOCUMENTS

| | | | | | |
|---|---|---|---|---|---|
| 5,468,296 A | * | 11/1995 | Patrick | .............. | H01J 37/32082 118/723 MP |
| 5,474,648 A | * | 12/1995 | Patrick | .............. | H01J 37/32935 700/121 |
| 5,681,393 A | * | 10/1997 | Takagi | ................. | H01J 37/3211 118/723 I |
| 6,259,334 B1 | * | 7/2001 | Howald | ............ | H01J 37/32183 333/32 |
| 6,495,963 B1 | * | 12/2002 | Bennett | ................. | H01J 37/321 315/111.21 |
| 6,750,711 B2 | * | 6/2004 | Chawla | ................... | H03F 3/193 330/251 |
| 6,761,963 B2 | * | 7/2004 | Casper | .................... | H01L 28/55 428/209 |

(Continued)

FOREIGN PATENT DOCUMENTS

| | | |
|---|---|---|
| JP | 2003-163099 A | 6/2003 |
| JP | 2003-273035 A | 9/2003 |

(Continued)

*Primary Examiner* — Srinivas Sathiraju
(74) *Attorney, Agent, or Firm* — Venjuris, P.C.

(57) ABSTRACT

A plasma generating apparatus includes: an electrode pair including a first plasma electrode and a second plasma electrode that are arranged to face each other; an RF power supply that supplies an RF power to the electrode pair; and a matching unit provided between the RF power supply and the electrode pair. The matching unit includes: a first variable capacitor and a second variable capacitor that are connected in parallel with respect to a load between the electrode pair; a coil connected in series with the first plasma electrode; and a capacitor connected in series with the second plasma electrode.

9 Claims, 5 Drawing Sheets

(56) References Cited

U.S. PATENT DOCUMENTS

| | | | | |
|---|---|---|---|---|
| 6,855,225 B1* | 2/2005 | Su | H01J 37/321 | 156/345.48 |
| 7,018,553 B2* | 3/2006 | Liu | H01J 37/32935 | 216/60 |
| 7,442,273 B2* | 10/2008 | Kwon | H01J 37/32082 | 156/345.43 |
| 7,462,335 B2* | 12/2008 | Liu | H01J 37/32532 | 315/111.21 |
| 8,336,490 B2* | 12/2012 | Matsuura | H01J 37/32532 | 156/345.35 |
| 9,805,915 B2* | 10/2017 | Gushiken | H01J 37/32174 | |
| 11,694,890 B2* | 7/2023 | Ito | H01J 37/32449 | 438/775 |
| 2002/0125223 A1 | 9/2002 | Johnson | H02M 7/533 | 219/121.54 |
| 2002/0149425 A1* | 10/2002 | Chawla | H03F 3/211 | 330/251 |
| 2003/0038112 A1* | 2/2003 | Liu | H01J 37/3299 | 216/60 |
| 2005/0031796 A1* | 2/2005 | Wu | H01J 37/32174 | 118/715 |
| 2005/0069651 A1* | 3/2005 | Miyoshi | H01J 37/321 | 427/452 |
| 2005/0194355 A1* | 9/2005 | Lohokare | H01J 37/32174 | 216/68 |
| 2008/0011716 A1* | 1/2008 | Nishio | H01J 37/321 | 216/67 |
| 2009/0056877 A1* | 3/2009 | Matsuura | H01J 37/321 | 156/345.48 |
| 2010/0073104 A1* | 3/2010 | Cotter | H03H 7/40 | 333/17.3 |
| 2012/0103525 A1* | 5/2012 | Matsuura | H01J 37/321 | 156/345.48 |
| 2012/0145322 A1* | 6/2012 | Gushiken | H01J 37/321 | 156/345.28 |
| 2016/0308560 A1* | 10/2016 | Howald | H05B 6/50 | |
| 2017/0032938 A1* | 2/2017 | Bhutta | H03H 7/0138 | |
| 2017/0294293 A1* | 10/2017 | Howald | H01J 37/32183 | |
| 2018/0110098 A1* | 4/2018 | Maruyama | H05B 6/54 | |
| 2019/0326094 A1* | 10/2019 | Bhutta | H01L 21/31116 | |
| 2019/0355554 A1* | 11/2019 | Ulrich | H01L 21/0262 | |
| 2020/0035461 A1* | 1/2020 | Bhutta | H01L 21/31116 | |
| 2020/0126765 A1* | 4/2020 | Ulrich | H01J 37/32183 | |
| 2020/0203130 A1* | 6/2020 | Bhutta | H01L 21/32136 | |
| 2020/0343077 A1* | 10/2020 | Lozic | H01L 21/28556 | |
| 2021/0351005 A1* | 11/2021 | Kobayashi | H01L 21/68764 | |
| 2022/0020572 A1* | 1/2022 | Matsuura | H01J 37/32568 | |
| 2022/0122812 A1* | 4/2022 | Kobayashi | H01J 37/32183 | |
| 2023/0129976 A1* | 4/2023 | Kobayashi | C23C 16/45544 | 438/792 |
| 2023/0215696 A1* | 7/2023 | Decker | H01L 21/31138 | 333/17.3 |
| 2023/0235460 A1* | 7/2023 | Kobayashi | H01J 37/32183 | 118/726 |

FOREIGN PATENT DOCUMENTS

| | | |
|---|---|---|
| JP | 2006-073913 A | 3/2006 |
| JP | 2006-213967 A | 8/2006 |
| JP | 2009-076797 A | 4/2009 |
| JP | 2016-528667 A | 9/2016 |

* cited by examiner

FIG. 5

| Plasma condition | Preset | | | Preset update Warning | | Start | | Constant Pf [W] |
|---|---|---|---|---|---|---|---|---|
| | C1 [%] | C2 [%] | Update Pr [W] | C1 [%] | C2 [%] | Pf [W] | Time [sec] | |
| A | | | | | | | | |
| B | | | | | | | | |
| C | | | | | | | | |
| D | | | | | | | | |
| E | | | | | | | | |

PLASMA GENERATING APPARATUS, PLASMA PROCESSING APPARATUS, AND PLASMA PROCESSING METHOD

CROSS-REFERENCE TO RELATED APPLICATION

This application is based on and claims priority from Japanese Patent Application No. 2020-175968 filed on Oct. 20, 2020 with the Japan Patent Office, the disclosure of which is incorporated herein in its entirety by reference.

TECHNICAL FIELD

The present disclosure relates to a plasma generating apparatus, a plasma processing apparatus, and a plasma processing method.

BACKGROUND

A technique is known in which a matching circuit including a coil and a variable capacitor is connected between an RF power supply and a plasma electrode, and the impedance on the load as seen from the RF power supply is controlled by adjusting the capacitance of the variable capacitor (see, e.g., Japanese Patent Laid-Open Publication Nos. 2006-213967 and 2006-073913).

SUMMARY

According to an aspect of the present disclosure, a plasma generating apparatus includes: an electrode pair including a first plasma electrode and a second plasma electrode that are arranged to face each other; an RF power supply configured to supply an RF power to the electrode pair; and a matching unit provided between the RF power supply and the electrode pair. The matching unit includes: a first variable capacitor and a second variable capacitor that are connected in parallel with respect to a load between the electrode pair; a coil connected in series with the first plasma electrode; and a capacitor connected in series with the second plasma electrode.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a view illustrating an example of a preset table.

DETAILED DESCRIPTION

Figure 1:
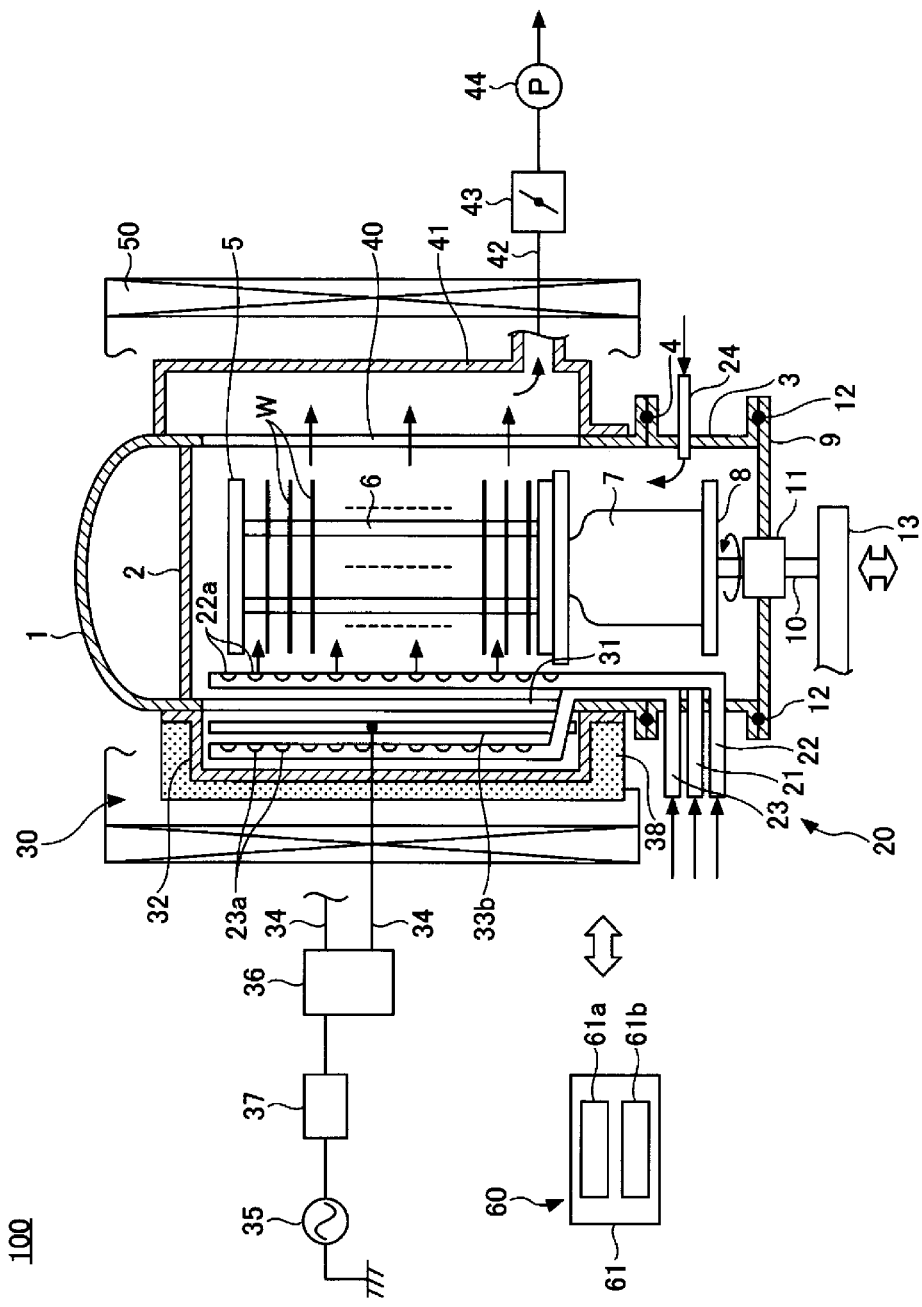
FIG. 1 is a schematic view illustrating an example of a plasma processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In the accompanying drawings, the same or corresponding members or parts are denoted by the same or corresponding reference numerals, and redundant explanations thereof are omitted.

Plasma Processing Apparatus

Figure 2:
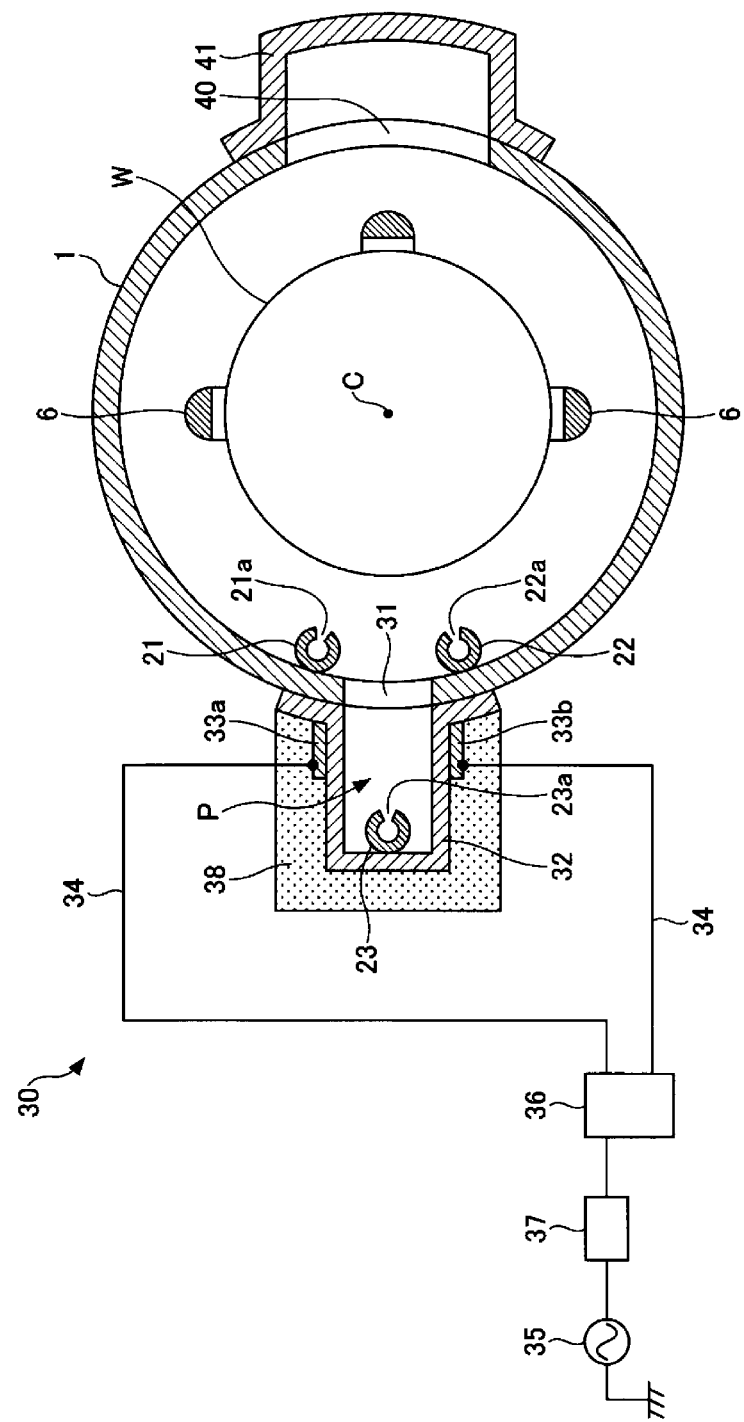
FIG. 2 is a cross-sectional view of the plasma processing apparatus of FIG. 1.

An example of a plasma processing apparatus of an embodiment will be described with reference to FIGS. 1 and 2.

The plasma processing apparatus 100 includes a processing container 1. The processing container 1 has a vertical tubular shape with a ceiling having an open lower end. The entire processing container 1 is formed of, for example, quartz. A ceiling plate 2 formed of quartz is provided near the upper end of the processing container 1, and a region below the ceiling plate 2 is sealed. A metal manifold 3 formed into a tubular shape is connected to the opening at the lower end of the processing container 1 via a sealing member 4.

The manifold 3 supports the lower end of the processing container 1, and a wafer boat 5 on which a plurality of (e.g., 25 to 150) semiconductor wafers (hereinafter, referred to as "wafers W") is placed in multiple tiers as substrates is inserted into the processing container 1 from below the manifold 3. In this way, a plurality of wafers W is accommodated in the processing container 1 substantially horizontally with an interval along the vertical direction. The wafer boat 5 is formed of, for example, quartz. The wafer boat 5 has three rods 6 (see, e.g., FIG. 2), and a plurality of wafers W is supported by grooves (not illustrated) formed in the rods 6.

The wafer boat 5 is placed on a table 8 via a heat insulating cylinder 7 formed of quartz. The table 8 is supported on a rotary shaft 10 penetrating a metal cover 9 that opens and closes the opening at the lower end of the manifold 3.

A magnetic fluid seal 11 is provided at the penetrating portion of the rotary shaft 10. The magnetic fluid seal 11 hermetically seals and rotatably supports the rotary shaft 10. A sealing member 12 is provided between the peripheral portion of the cover 9 and the lower end of the manifold 3. The sealing member 12 maintains the airtightness inside the processing container 1.

The rotary shaft 10 is attached to the tip of an arm 13 supported by an elevating mechanism (not illustrated) such as, for example, a boat elevator, and the wafer boat 5 and the cover 9 integrally move up and down, and are inserted into and removed from the inside of the processing container 1. The table 8 may be fixedly provided on the cover 9, and the wafer W may be processed without rotating the wafer boat 5.

The plasma processing apparatus 100 has a gas supply 20 that supplies various processing gases into the processing container 1.

The gas supply 20 has, for example, four gas nozzles 21 to 24. However, the gas supply 20 may have another gas nozzle in addition to the four gas nozzles 21 to 24.

The gas nozzle 21 is formed of, for example, quartz, and has an L-shape that penetrates the side wall of the manifold 3 inward, is bent upward, and extends vertically. The vertical portion of the gas nozzle 21 is provided outside a plasma generation space P, for example, on the plasma generation space P side rather than the center C of the processing container 1 in the processing container 1. However, for example, the vertical portion of the gas nozzle 21 may be provided on the side of an exhaust port 40 rather than the center C of the processing container 1 in the processing container 1. The gas nozzle 21 is connected to a source of hexachlorodisilane (HCD) gas. In the vertical portion of the gas nozzle 21, a plurality of gas holes 21a is formed at intervals over the length in the vertical direction corresponding to a wafer support range of the wafer boat 5. The gas hole 21a is oriented toward, for example, the center C of the processing container 1, and discharges the HCD gas in the horizontal direction toward the center C of the processing container 1. However, the gas hole 21a may be oriented toward, for example, the inner wall in the vicinity of the processing container 1. The gas nozzle 21 may be further connected to a purge gas source. Examples of the purge gas include argon (Ar) gas and nitrogen ($N_2$) gas.

The gas nozzle 22 is formed of, for example, quartz, and has an L-shape that penetrates the side wall of the manifold 3 inward, is bent upward, and extends vertically. The vertical portion of the gas nozzle 22 is provided outside a plasma generation space P, for example, in the processing container 1 on the side of the plasma generation space P with respect to the center C of the processing container 1. However, for example, the vertical portion of the gas nozzle 22 may be provided in the processing container 1 on the side of an exhaust port 40 with respect to the center C of the processing container 1. The gas nozzle 22 is connected to a source of ammonia ($NH_3$) gas and a source of hydrogen ($H_2$) gas. The $NH_3$ gas and the $H_2$ gas are examples of plasma generation gas. In the vertical portion of the gas nozzle 22, a plurality of gas holes 22a is formed at intervals over the length in the vertical direction corresponding to the wafer support range of the wafer boat 5. The gas hole 22a is oriented toward, for example, the center C of the processing container 1, and discharges the $NH_3$ gas and the $H_2$ gas in the horizontal direction toward the center C of the processing container 1. However, the gas hole 22a may be oriented, for example, toward the plasma generation space P, or may be oriented toward the inner wall in the vicinity of the processing container 1. The gas nozzle 22 may be further connected to a purge gas source.

The gas nozzle 23 is formed of, for example, quartz, and has an L-shape that penetrates the side wall of the manifold 3 inward, is bent upward, and extends vertically. The vertical portion of the gas nozzle 23 is provided in the plasma generation space P. The gas nozzle 23 is connected to a source of $NH_3$ gas and a source of $H_2$ gas. The $NH_3$ gas and the $H_2$ gas are examples of plasma generation gas. In the vertical portion of the gas nozzle 23, a plurality of gas holes 23a is formed at intervals over the length in the vertical direction corresponding to the wafer support range of the wafer boat 5. The gas hole 23a is oriented toward, for example, the center C of the processing container 1, and discharges the $NH_3$ gas and the $H_2$ gas in the horizontal direction toward the center C of the processing container 1. The gas nozzle 23 may be further connected to a purge gas source.

The gas nozzle 24 is formed of, for example, quartz and has a straight pipe shape extending horizontally through the side wall of the manifold 3. The tip of the gas nozzle 24 is provided outside the plasma generation space P, for example, inside the processing container 1. The gas nozzle 24 is connected to a purge gas source. The tip of the gas nozzle 24 is open, and purge gas is supplied into the processing container 1 from the opening.

A plasma generating apparatus 30 is provided on a part of the side wall of the processing container 1. The plasma generating apparatus 30 turns the $NH_3$ gas and the $H_2$ gas supplied from the gas nozzles 22 and 23 into plasma to generate active species.

The plasma generating apparatus 30 includes a plasma partition wall 32, an electrode pair 33, a wiring 34, an RF power supply 35, a matching unit 36, an RF sensor 37, and an insulation protective cover 38.

The plasma partition wall 32 is airtightly welded to the outer wall of the processing container 1. The plasma partition wall 32 is formed of, for example, quartz. The plasma partition wall 32 has a concave cross section and covers the opening 31 formed in the side wall of the processing container 1. The opening 31 is formed elongated in the vertical direction so as to cover all wafers W supported by the wafer boat 5 in the vertical direction. The gas nozzle 23 is provided in the inner space defined by the plasma partition wall 32 and communicating with the inside of the processing container 1, that is, the plasma generation space P. Further, the gas nozzles 21 and 22 are provided at positions closer to the wafer W along the inner side wall of the processing container 1 outside the plasma generation space P.

The electrode pair 33 includes plasma electrodes 33a and 33b. The plasma electrodes 33a and 33b each have an elongated shape, and are arranged so as to face each other along the vertical direction on the outer surfaces of the walls on both sides of the plasma partition wall 32. The wiring 34 is connected to the plasma electrodes 33a and 33b.

The wiring 34 electrically connects the electrode pair 33 and the RF power supply 35. For example, one end of the wiring 34 is connected to an intermediate position on the longer sides of the plasma electrodes 33a and 33b, and the other end thereof is connected to the RF power supply 35.

The RF power supply 35 is electrically connected to the electrode pair 33 via the matching unit 36 to supply the RF power to the electrode pair 33. Thus, the RF power is applied to the plasma generation space P defined by the plasma partition wall 32. As a result, the $NH_3$ gas and the $H_2$ gas discharged from the gas nozzles 22 and 23 are turned into plasma in the plasma generation space P and the processing container 1, and the active species generated thereby is supplied to the wafer W. The frequency of the RF power may be, for example, 400 kHz to 100 MHz.

The matching unit 36 is provided between the RF power supply 35 and the electrode pair 33. The matching unit 36 matches the impedance on the load seen from the RF power supply 35 with the output impedance of the RF power supply 35. Hereinafter, a position where the impedance on the load seen from the RF power supply 35 matches the output impedance of the RF power supply 35 is also referred to as a matching position. Details of the matching unit 36 will be described later.

The RF sensor 37 is provided between the RF power supply 35 and the matching unit 36 in the wiring 34. The RF sensor 37 detects the power of the reflected wave from the electrode pair 33. The RF sensor 37 controls the RF power supply 35 based on the detected power of the reflected wave. For example, when the power of the reflected wave is larger than a predetermined value, the RF sensor 37 suppresses the reflected wave by controlling the output of the RF power supplied by the RF power supply 35 to the electrode pair 33. Further, for example, in a case where the RF power supply 35 has a frequency variable function, when the detected power of the reflected wave is larger than a predetermined value, the RF sensor 37 suppresses the reflected wave by controlling the frequency of the RF power supplied by the RF power supply 35 to the electrode pair 33. The detected value of the RF sensor 37 is output to the controller 60, and the controller 60 controls the impedance by adjusting the matching unit 36 based on the output of the RF sensor 37. Also, the control of the RF power supply 35 by the RF sensor 37 and the control of the matching unit 36 by the controller 60 may be performed individually or synchronously.

The insulation protective cover 38 is attached to the outside of the plasma partition wall 32 so as to cover the plasma partition wall 32. A coolant passage (not illustrated) is provided in the inner portion of the insulation protection cover 38, and the plasma electrodes 33a and 33b are cooled by causing a coolant to flow through the coolant passage. A shield (not illustrated) may be provided between the plasma electrodes 33a and 33b and the insulation protective cover 38 so as to cover the plasma electrodes 33a and 33b. The shield is formed of a good conductor such as metal and is grounded.

An exhaust port 40 for evacuating the inside of the processing container 1 is provided on the side wall of the processing container 1 facing the opening 31. The exhaust port 40 is vertically elongated to correspond to the wafer boat 5. An exhaust port cover member 41 having a U-shaped cross section is attached to a portion of the processing container 1 corresponding to the exhaust port 40 so as to cover the exhaust port 40. The exhaust port cover member 41 extends upward along the side wall of the processing container 1. An exhaust pipe 42 for exhausting the processing container 1 is connected to the lower part of the exhaust port cover member 41 via the exhaust port 40. An exhaust device 44 including a pressure control valve 43 for controlling the pressure in the processing container 1 and a vacuum pump is connected to the exhaust pipe 42, and the inside of the processing container 1 is exhausted by the exhaust device 44 via the exhaust pipe 42.

A heating mechanism 50 is provided around the processing container 1. The heating mechanism 50 has a tubular shape. The heating mechanism 50 heats the processing container 1 and the wafer W accommodated therein.

The plasma processing apparatus 100 includes a controller 60. The controller 60 controls, for example, the operation of each unit of the plasma processing apparatus 100. The controller 60 includes, for example, a computer 61. The computer 61 includes, for example, a CPU 61a and a storage unit 61b. The CPU 61a may be configured to perform various control operations based on the program stored in the storage unit 61b. The storage unit 61b includes auxiliary storage devices such as a random access memory (RAM), a read only memory (ROM), a hard disk drive (HDD), and a solid state drive (SSD).

Matching Unit

Figure 3:
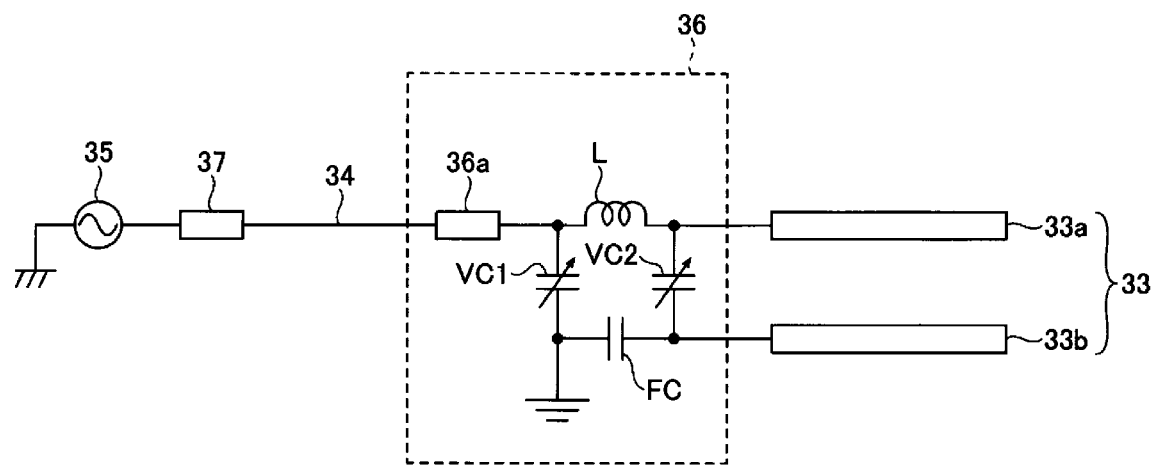
FIG. 3 is a view illustrating an example of a plasma generating apparatus according to the embodiment.

An example of a matching unit of an embodiment will be described with reference to FIG. 3. The matching unit of the embodiment is applied to, for example, the plasma generating apparatus 30 of the plasma processing apparatus 100. However, the matching unit of the embodiment is applicable to, for example, a capacitively coupled plasma (CCP) apparatus different from the plasma processing apparatus 100.

The matching unit 36 is provided between the RF power supply 35 and the electrode pair 33. The matching unit 36 matches the impedance on the load seen from the RF power supply 35 with the output impedance of the RF power supply 35.

The matching unit 36 includes variable capacitors VC1 and VC2, a coil L, a fixed capacitor FC, and an RF sensor 36a.

The variable capacitors VC1 and VC2 are connected in parallel with respect to the plasma load between the electrode pair 33. The variable capacitors VC1 and VC2 are capacitors whose capacitance may be changed. The variable capacitor VC1 is connected between the wirings 34 on the side farther from the electrode pair 33 than the coil L and the fixed capacitor FC. The variable capacitor VC2 is connected between the wirings 34 on the side closer from the electrode pair 33 than the coil L and the fixed capacitor FC.

The coil L is connected in series with the plasma electrode 33a. The coil L may be a fixed coil having a fixed inductance, or a variable coil capable of changing the inductance.

The fixed capacitor FC is connected in series with the plasma electrode 33b. The fixed capacitor FC has a fixed capacitance. The fixed capacitor FC may be replaced with a variable capacitor.

The RF sensor 36a is connected in series with the plasma electrode 33b. The RF sensor 36a is provided between the coil L and the RF sensor 37 in the wiring 34. The RF sensor 36a detects the power of the reflected wave from the electrode pair 33. The detected value of the RF sensor 36a is output to the controller 60, and the controller 60 controls the impedance by adjusting the matching unit 36 (capacities of the variable capacitors VC1 and VC2) based on the output of the RF sensor 36a. Only one of the RF sensors 36a and 37 may be provided.

Plasma Processing Method

An example of the plasma processing method implemented by the plasma processing apparatus 100 of the embodiment will be described. Hereinafter, as an example, descriptions will be made on a case where a silicon nitride film is formed on the surface of the wafer.

First, the controller 60 moves up the wafer boat 5 holding a plurality of wafers W into the processing container 1 adjusted to a predetermined temperature in advance from below and loads the wafer boat 5, and closes the opening at the lower end of the manifold 3 with the cover 9 to seal the inside of the processing container 1.

Subsequently, the controller 60 evacuates the inside of the processing container 1 to maintain a predetermined process pressure, and increases the power supply to the heating mechanism 50 to raise the wafer temperature and maintain the process temperature. Further, the controller 60 forms a silicon nitride film by supplying various processing gases from the gas nozzles 21 to 23 to the surface of the wafer W supported by the wafer boat 5.

Specifically, the controller 60 adsorbs the HCD gas on the surface of the wafer by discharging the HCD gas from the gas hole 21a of the gas nozzle 21. Subsequently, the controller 60 discharges the $NH_3$ gas from the gas holes 22a and 23a of the gas nozzles 22 and 23, and applies an RF voltage between the plasma electrodes 33a and 33b by the RF power supply 35. Thus, the $NH_3$ gas is turned into plasma and activated, and an active species is generated. Examples of the active species include N radicals (N*), NH radicals (NH*), $NH_2$ radicals (NH*), and $NH_3$ radicals (NH3*). The active species are released and diffuse toward the center in the processing container 1, and react with the molecules of HCD gas adsorbed on the surface of the wafer W to form a silicon nitride film.

The matching unit 36 includes variable capacitors VC1 and VC2 connected in parallel with respect to the plasma load between the electrode pair 33, a coil L connected in series with the plasma electrode 33a, and a fixed capacitor FC connected in series with the plasma electrode 33b. Thus, since the potentials at both ends of the plasma load between the electrode pair 33 are adjusted in phase, the potential difference between the plasma electrodes 33a and 33b becomes smaller compared with the case where one electrode of the electrode pair 33 (e.g., the plasma electrode 33b) is grounded. Therefore, when the RF power is supplied from the RF power supply 35 to the electrode pair 33 via the matching unit 36, plasma is also generated between the plasma electrode 33a (or the plasma electrode 33b) or both and the wafer W (in the processing container 1), in addition to between the plasma electrodes 33a and 33b (plasma generation space P). As a result, the activity of the active species contained in the plasma is increased in the vicinity of the wafer W, and the efficiency of plasma processing on the wafer W may be increased.

Further, when the RF power supply 35 supplies the RF power between the electrode pair 33, the controller 60 may control the RF power supply 35 so as to first supply the RF power at a first output, and then the RF power at a second output lower than the first output. This improves plasma ignitability.

Further, when the RF power supply 35 supplies the RF power between the electrode pair 33, the controller 60 may control the RF power supply 35 so as to first supply the RF power at a first frequency, and then the RF power at a second frequency lower than the first frequency. This improves plasma ignitability. Further, the controller 60 may control both the output and frequency of the RF power.

Method of Updating Preset Positions

Figure 4:
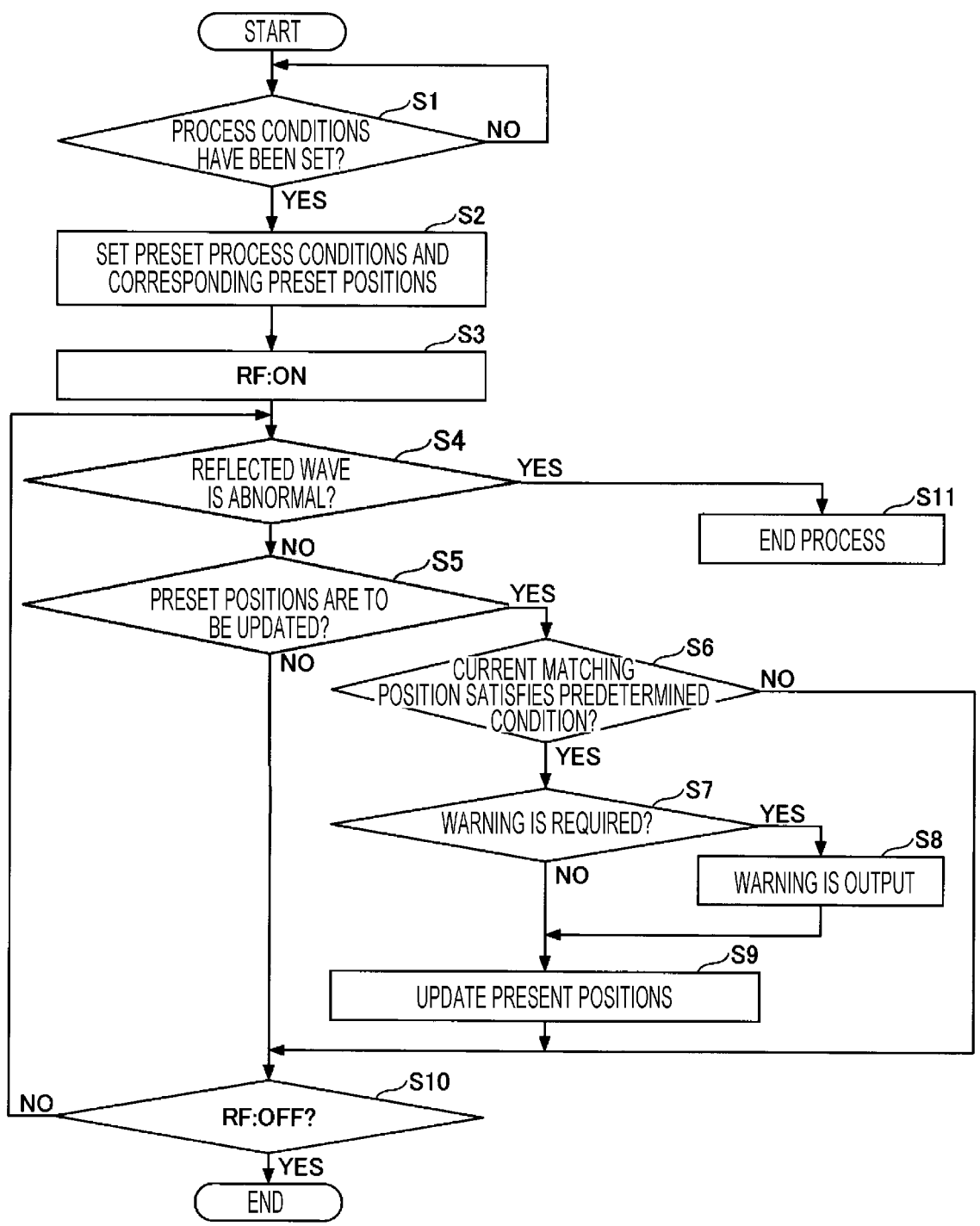
FIG. 4 is a flow chart illustrating an example of a method of updating preset positions according to the embodiment.

An example of the method of updating the preset positions of the embodiment will be described with reference to FIGS. 4 and 5. The method of updating the preset positions of the embodiment is continuously performed, for example, during the period during which the plasma processing apparatus 100 is in operation.

In step S1, the controller 60 determines whether the process conditions have been set. The process conditions include, for example, a processing gas, a temperature, a pressure, and an RF power. When it is determined in step S1 that the process conditions have been set, the controller 60 advances the process to step S2. Meanwhile, when it is determined in step S1 that the process conditions have not been set, the controller 60 returns the process to step S1. That is, the controller 60 repeats step S1 until the process conditions are set.

In step S2, the controller 60 sets the preset positions associated with condition A based on the process condition set in step S1 (e.g., condition A) and the correspondence information associated with the process condition and the preset positions of the variable capacitors VC1 and VC2. The correspondence information is generated in advance before performing, for example, the method of updating the preset positions, and is stored in the storage unit 61b.

The correspondence information may be a preset table 500 in which the preset positions of the variable capacitors VC1 and VC2 are associated with each process condition, for example, as illustrated in FIG. 5. The preset table 500 includes a Preset, a Preset update Warning, an ignition setting (Start), and a steady state setting (Constant) associated with each process condition (Plasma condition).

The preset includes the preset position C1 [%] of the variable capacitor VC1, the preset position C2 [%] of the variable capacitor VC2, and the power Pr [W] of the reflected wave for update determination. The preset update warning is used to determine whether to output a warning when updating the preset positions of the variable capacitors VC1 and VC2, and includes the preset positions C1 [%] and C2 [%] of the variable capacitors VC1 and VC2. The ignition setting includes the power Pf [W] of a traveling wave supplied from the RF power supply 35 to the electrode pair 33 when the plasma is ignited, and a time t [sec] at which the power Pf of the traveling wave is supplied. The steady state setting includes the power Pf [W] of the traveling wave supplied from the RF power supply 35 to the electrode pair 33 after the time t has elapsed from the time of ignition.

In step S3, the controller 60 supplies the RF power to the electrode pair 33 by turning on the RF power supply 35. At this time, the matching position may deviate from the preset positions set in step S2 due to the difference in the cumulative film thickness and the process conditions in the processing container 1, and the power of the reflected wave may increase.

In step S4, the controller 60 determines whether the reflected wave is abnormal. For example, when the power of the reflected wave detected by the RF sensor 37 is continuously equal to or greater than a predetermined value for a predetermined time, the controller 60 determines that the reflected wave is abnormal. The predetermined time and the predetermined value are determined by, for example, a preliminary experiment. When it is determined in step S4 that the reflected wave is abnormal, the controller 60 turns off the RF power supply 35 and ends the process (step S11). Meanwhile, when it is determined in step S4 that the reflected wave is not abnormal, the controller 60 advances the process to step S5.

In step S5, the controller 60 determines whether to update the preset positions of the variable capacitors VC1 and VC2. For example, when the power of the reflected wave detected by the RF sensor 37 is equal to or smaller than the power Pr of the reflected wave for update determination associated with condition A of the preset table 500, the controller 60 determines that the preset positions of the variable capacitors VC1 and VC2 are updated. Meanwhile, when the power of the reflected wave detected by the RF sensor 37 is equal to or greater than the power Pr of the reflected wave for update determination associated with condition A of the preset table 500, the controller 60 determines that the variable capacitors VC1 and VC2 are not updated. When it is determined in step S5 that the preset positions of the variable capacitors VC1 and VC2 are to be updated, the controller 60 advances the process to step S6. When it is determined in step S5 that the preset positions of the variable capacitors VC1 and VC2 are not updated, the controller 60 advances the process to step S6.

In step S6, the controller 60 determines whether the current matching position satisfies a predetermined condition. For example, the controller 60 compares the current positions of the variable capacitors VC1 and VC2 with the preset positions of the variable capacitors VC1 and VC2 associated with condition A of the preset table 500, and when the difference between the positions is included in the predetermined range, the controller 60 determines that the predetermined condition has been satisfied. Meanwhile, the controller 60 compares the current positions of the variable capacitors VC1 and VC2 with the preset positions of the variable capacitors VC1 and VC2 associated with condition A of the preset table 500, and when the difference between the positions is not included in the predetermined range, the controller 60 determines that the predetermined condition has not been satisfied. When it is determined in step S6 that the current matching position satisfies a predetermined condition, the controller 60 advances the process to step S7. Meanwhile, when it is determined in step S6 that the current matching position does not satisfy a predetermined condition, the controller 60 advances the process to step S10.

In step S7, the controller 60 determines whether a warning is required when updating the preset positions. For example, when the current positions of the variable capacitors VC1 and VC2 exceed the preset position of the preset update warning associated with condition A of the preset table 500, the controller 60 determines that a warning is necessary. Meanwhile, when the current positions of the variable capacitors VC1 and VC2 do not exceed the preset position of the preset update warning associated with condition A of the preset table 500, the controller 60 determines that a warning is not necessary. When it is determined in step S7 that a warning is not necessary, the controller 60 advances the process to step S8. Meanwhile, when it is determined in step S7 that a warning is not necessary, the controller 60 advances the process to step S9.

In step S8, the controller 60 outputs a warning.

In step S9, the controller 60 updates the preset positions of the variable capacitors VC1 and VC2. For example, the controller 60 updates the current positions of the variable capacitors VC1 and VC2 as new preset positions. Further, for example, the controller 60 may update a position shifted by a predetermined value from the current positions of the variable capacitors VC1 and VC2 as a new preset position. In this way, the controller 60 updates the preset positions of the variable capacitors VC1 and VC2 of the preset table 500 based on the current positions of the variable capacitors VC1 and VC2.

In step S10, the controller 60 determines whether the RF power supply 35 has been turned off. When it is determined in step S10 that the RF power supply has been turned off, the controller 60 ends the process. Meanwhile, when it is determined in step S10 that the RF power supply 35 has not been turned off, the controller 60 returns the process to step S4.

According to the method of updating the preset positions of the above-described embodiment, the controller 60 determines whether it is necessary to update the preset position associated with each process condition each time the process is executed, and updates the preset position if necessary. As a result, it is possible to suppress the reflected wave immediately after the plasma ignition generated by the deviation of the matching position due to the difference in the cumulative film thickness and the process conditions in the processing container 1.

In particular, in the plasma processing method using the plasma processing apparatus 100 of the embodiment, when the RF power is supplied from the RF power supply 35 to the electrode pair 33 via the matching unit 36, plasma is also generated between the plasma electrode 33a and the wafer W (inside the processing container 1). Therefore, the matching positions of the variable capacitors VC1 and VC2 are easily affected by the process conditions including the processing gas, temperature, pressure, and RF power, as compared with the case where plasma is generated only between the plasma electrodes 33a and 33b. In the embodiment, the preset table 500 in which the preset positions are associated with each process condition is stored in the storage unit 61b, and it is determined whether the preset position needs to be updated each time the process is executed, and the preset position is updated if necessary. As a result, even when the process conditions are different from each other, the reflected wave immediately after the plasma ignition caused by the deviation of the matching position may be suppressed.

In the method of updating the preset positions of the embodiment, steps S6 to S8 may be omitted.

In the above-described embodiment, the variable capacitor VC1 is an example of a first variable capacitor, and the variable capacitor VC2 is an example of a second variable capacitor. Further, the plasma electrode 33a is an example of a first plasma electrode, and the plasma electrode 33b is an example of a second plasma electrode.

In the above-described embodiment, descriptions have been made on the case where the coil L is connected in series with the plasma electrode 33a and the fixed capacitor FC is connected in series with the plasma electrode 33b, but the present disclosure is not limited thereto. For example, the coil L and the fixed capacitor FC may be exchanged with each other. Specifically, the fixed capacitor FC may be connected in series with the plasma electrode 33a, and the coil L may be connected in series with the plasma electrode 33b. In this case, the fixed capacitor FC may be replaced with a variable capacitor, and the coil L may be a fixed coil or a variable coil.

According to the present disclosure, the efficiency of plasma processing on a substrate may be increased.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma generating apparatus comprising:
   an electrode pair including a first plasma electrode and a second plasma electrode that respectively extend in a vertical direction to face each other;
   an RF power supply configured to supply an RF power to the electrode pair; and
   a matching box provided between the RF power supply and the electrode pair,
   wherein the matching box includes:
      a first variable capacitor and a second variable capacitor that are connected in parallel with respect to a load between the electrode pair;
      a coil connected in series with the first plasma electrode; and
      a capacitor connected in series with the second plasma electrode,
      wherein the first variable capacitor is connected between wirings provided on a side farther from the electrode pair than the coil and the capacitor, and
      the second variable capacitor is connected between the wirings provided on a side closer to the electrode pair than the coil and the capacitor.

2. A plasma processing apparatus comprising:
   a processing container configured to accommodate a substrate;
   a plasma generator configured to generate plasma in the processing container; and a controller,
wherein the plasma generator includes:
- an electrode pair including a first plasma electrode and a second plasma electrode that respectively extend in a vertical direction to face each other;
- an RF power supply configured to supply an RF power to the electrode pair; and
- a matching box provided between the RF power supply and the electrode pair, and the matching box includes:
- a first variable capacitor and a second variable capacitor that are connected in parallel with respect to a load between the electrode pair;
- a coil connected in series with the first plasma electrode; and
- a capacitor connected in series with the second plasma electrode, wherein the first variable capacitor is connected between wirings provided on a side farther from the electrode pair than the coil and the capacitor, and the second variable capacitor is connected between the wirings provided on a side closer to the electrode pair than the coil and the capacitor.

3. The plasma processing apparatus according to claim 2, wherein, when supplying the RF power to the electrode pair, the controller controls the RF power supply to first supply the RF power at a first output and then supply the RF power at a second output lower than the first output.

4. The plasma processing apparatus according to claim 2, wherein, when supplying the RF power to the electrode pair, the controller controls the RF power supply to first supply the RF power at a first frequency and then supply the RF power at a second frequency lower than the first frequency.

5. The plasma processing apparatus according to claim 2, further comprising:
- a storage configured to store correspondence information in which a condition of a plasma processing is associated with preset positions of the first variable capacitor and the second variable capacitor,
- wherein, when supplying the RF power from the RF power supply to the electrode pair, the controller sets the preset positions of the first variable capacitor and the second variable capacitor based on the correspondence information stored in the storage.

6. The plasma processing apparatus according to claim 5, further comprising:
- an RF sensor configured to detect a power of a reflected wave when supplying the RF power from the RF power supply to the electrode pair,
- wherein the controller determines whether to update the preset positions stored in the storage based on the power of the reflected wave detected by the RF sensor.

7. The plasma processing apparatus according to claim 2, wherein the processing container has a tubular shape with an opening formed in a side wall, the plasma generating apparatus further comprises a plasma partition wall that is airtightly provided on an outer wall of the processing container and covers the opening, and the electrode pair is arranged to face outer surfaces of walls on both sides of the plasma partition wall.

8. A plasma processing method comprising:
providing a plasma processing apparatus including:
- a processing container configured to accommodate the substrate; and
- a plasma generating apparatus configured to generate plasma in the processing container, wherein the plasma generating apparatus includes:
- an electrode pair including a first plasma electrode and a second plasma electrode that respectively extend in a vertical direction to face each other;
- an RF power supply configured to supply an RF power to the electrode pair; and
- a matching box provided between the RF power supply and the electrode pair, and wherein the matching box includes:
- a first variable capacitor and a second variable capacitor that are connected in parallel with respect to a load between the electrode pair;
- a coil connected in series with the first plasma electrode; and
- a capacitor connected in series with the second plasma electrode, wherein the first variable capacitor is connected between wirings provided on a side farther from the electrode pair than the coil and the capacitor, and the second variable capacitor is connected between the wirings provided on a side closer to the electrode pair than the coil and the capacitor, storing correspondence information in which a condition of a plasma processing performed by the plasma processing apparatus is associated with preset positions of the first variable capacitor and the second variable capacitor;

setting the preset positions of the first variable capacitor and the second variable capacitor based on the correspondence information stored in the storing;

after the setting, supplying the RF power from the RF power supply to the electrode pair; and determining whether to update the preset positions stored in the storing based on a power of a reflected wave when supplying the RF power from the RF power supply to the electrode pair.

9. The plasma processing apparatus according to claim 7, wherein an insulation protective cover is attached to an outside of the plasma partition wall so as to cover the plasma partition wall.

* * * * *